(12) United States Patent
Trask

(10) Patent No.: US 6,172,563 B1
(45) Date of Patent: Jan. 9, 2001

(54) LOSSLESS FEEDBACK TRANSISTOR AMPLIFIERS WITH LINEARITY AUGMENTATION

(76) Inventor: Christopher Trask, 1863 E. Palmcroft Dr., Tempe, AZ (US) 85282-2858

(*) Notice: Under 35 U.S.C. 154(b), the term of this patent shall be extended for 0 days.

(21) Appl. No.: 09/340,495

(22) Filed: Jun. 30, 1999

(51) Int. Cl.[7] ............................... H03F 1/26; H03F 1/30
(52) U.S. Cl. .......................... 330/149; 330/165; 330/296
(58) Field of Search ................................. 330/149, 165, 330/296

(56) References Cited

U.S. PATENT DOCUMENTS

| | | |
|---|---|---|
| 2,663,806 | 12/1953 | Darlington . |
| 3,891,934 * | 6/1975 | Norton et al. ........................ 330/165 |
| 4,590,434 | 5/1986 | Wagner . |
| 4,928,072 * | 5/1990 | Scott ..................................... 330/149 |

OTHER PUBLICATIONS

Abrahim, E.P. and Y.M. Bruk, "Highly Linear Broadband Amplifiers with Feedback," Telecommunications and Radio Engineering, vol. 41/42, No. 5, Mar. 1987, pp. 90–91.

Abrahim, E.P. and Y.M. Bruk, "Highly Linear Broadband Amplifiers with Lossless Feedback, Part 1: Tugorh," International Journal of Electronics, vol. 68, No. 5, pp. 743–756.

Abrahim, E.P. and Y.M. Bruk, and A.A. Kowovalehko, "Highly Linear Broadband Amplifiers with Lossless Feedback, Part 2: Experience and Development, " International Journal of Electronics, vol. 69, No. 3, pp. 345–357.

Blecher, F.H., "Transfer Multiple Loop Feedback Amplifier," Proceddings of The Hartman Electronics Conference, 1957, vol. 13, pp. 19–34.

Davis, E.M., "Comparisons Between Multiple Loop and Single Loop Transfer Feedback Amplifiers," Westoh Convention Record, 1958, vol. 2, Pt. 2, pp. 78–86.

Morton, D.E., "High Dynamic Range Transistor Amplifiers with Lossless Feedback," Microwave Journal, May 1976, pp. 53–57.

Morton, D.E., "High Dynamic Range Transistor Amplifiers with Lossless Feedback," Proceedings of the 1975 IEEE International Symposium on Circuits and Systems, pp. 438–440.

Trask, C., "Lossless Feedback Amplifiers," QRP Quarterly, Jan. 1998, pp. 40–41.

* cited by examiner

Primary Examiner—Michael B Shingleton

(57) ABSTRACT

A lossless feedback transistor amplifier circuit is described, including an input terminal and an output terminal, for the purpose of amplifying a signal voltage. The amplifier circuit also includes an augmentation circuit, connected from the emitter to the base of a common-base amplifying transistor, which detects an error voltage at the common-base transistor emitter, amplifies and inverts the error voltage, and then applies the amplified error voltage to the base of the common-base amplifying transistor, for the purpose of reducing the emitter error voltage and thus reducing the harmonic and intermodulation distortion of the lossless feedback amplifier. According to a further embodiment, a second transistor is used for amplifying the emitter error voltage. In a further embodiment, an inverting positive feedback amplifier is used for amplifying the emitter error voltage. In a further embodiment, a transformer is used to amplify and invert the emitter error voltage. Circuits are also described for augmented complementary lossless feedback transistor amplifiers.

13 Claims, 6 Drawing Sheets

LOSSLESS FEEDBACK TRANSISTOR AMPLIFIERS WITH LINEARITY AUGMENTATION

BACKGROUND OF THE INVENTION

The lossless-feedback transistor amplifier has been recognized as one of the more effective innovations in small-signal amplifier design. With its ability to deliver both low noise and high linearity response with a minimum amount of effort and cost, both being highly desirable characteristics in small-signal amplifier design, the lossless-feedback amplifier has enjoyed a wide range of applications in communications receiver and radio astronomy telescope receiver design. In a conventional lossless-feedback transistor amplifier, as shown in FIG. 1, the amplifier basically consists of a common-base amplifying transistor 105 and a feedback transformer 103. Generally, the design concept relies on the input impedance of the transistor, seen at the emitter, as being negligible. However, the finite nonlinear input resistance seen at the emitter degrades the expected performance, and the nonlinear nature of this resistance is the primary cause of both harmonic and intermodulation (IM) distortion. Traditional design techniques reduce this nonlinear resistance by increasing the transistor bias current, which produces a limited degree of improvement but which also reduces the overall power efficiency of the amplifier, which is undesirable. It is a desirable design goal to improve the linearity of amplifiers in general without incurring an increase in power consumption.

SUMMARY OF THE INVENTION

An augmented lossless-feedback transistor amplifier circuit with improved intermodulation (IM) performance is described which includes an augmented common base transistor amplifier. The augmented common-base transistor amplifier circuit further includes an augmentation circuit which detects an error voltage at the emitter of the common-base transistor, and which then inverts and amplifies the detected error voltage as a voltage to be applied at the base of the common-base transistor, thereby reducing the error voltage at the emitter of the common-base transistor and in turn improving the linearity and IM performance of the lossless-feedback transistor amplifier circuit. In a further embodiment the augmentation is accomplished by the addition of a common-emitter amplifier circuit. In a further embodiment suitable for higher frequency and lower noise applications, a transformer is used to perform the augmentation. In a further embodiment suitable for high dynamic-range applications, a positive feedback amplifier is used to perform the augmentation. In a further embodiment also suitable for higher dynamic-range applications, a complementary pair of augmented common-base transistors is used in place of the single-ended augmented common-base transistor.

BRIEF DESCRIPTION OF THE DRAWINGS

The invention is described in the schematics of FIGS. 1 to 6, in which.

DETAILED DESCRIPTION OF THE PREFERRED EMBODIMENT

Designers of high dynamic-range signal amplifiers, particularly in applications involving communications receivers, are concerned with elements of system performance which include, but are not limited to, intermodulation distortion (IM), noise figure (NF), power consumption and efficiency, and environmental conditions, particularly temperature. Historically, the IM performance of high dynamic-range signal amplifiers is improved by application of feedback methods or by increasing the bias current of the active devices. The latter of these is impractical for applications where portable operation utilizing batteries for power is involved, as the increase in power consumption shortens the amount of available operation time for a given battery supply. The former of these has been addressed by application of a feedback method known as lossless feedback, wherein a transformer is used to provide feedback coupling from the input to the output, the "lossless" nature of such feedback reducing the noise figure of the amplifier to that of the active device itself. Signal amplifiers using lossless feedback have enjoyed a wide range of applications, their reputation for low noise, good gain stability over temperature, low IM products, and low power consumption being desireable characteristics. A novel method and apparatus for further improving the IM characteristics of lossless feedback transistor amplifiers is presented, which in some instances provides the improvement without an increase in the power consumption.

Figure 1:
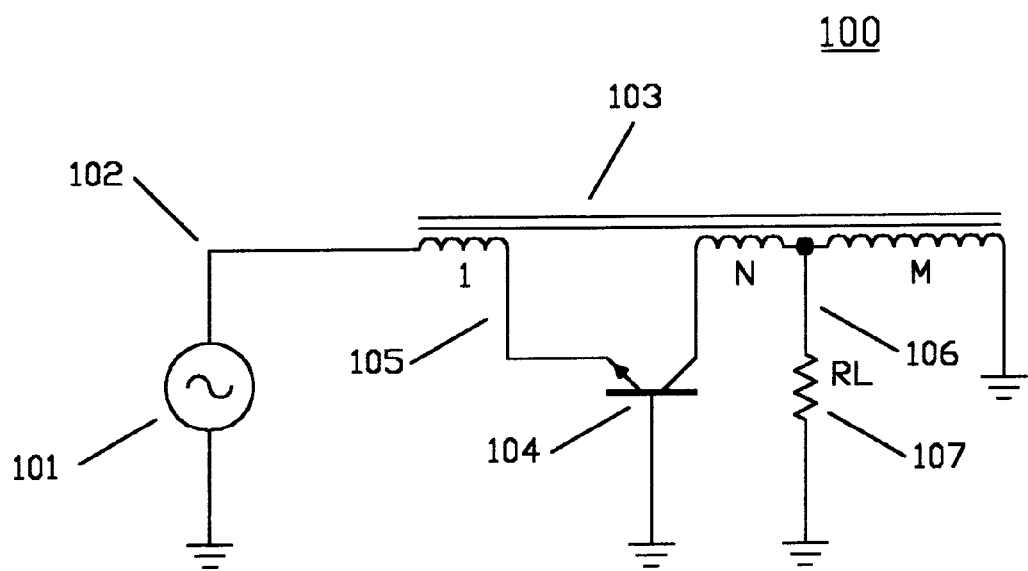
FIG. 1 schematically illustrates the existing prior art, commonly referred to as a lossless-feedback transistor amplifier.

Referring to FIG. 1, a lossless feedback transistor amplifier circuit 100 is shown in its most basic form. Here, a transformer 103, having a turns ratio of 1:N:M, provides the feedback coupling from the collector to the emitter of a transistor 104. An input signal voltage source 101 provides an input signal 102, having an amplitude A and a frequency $f_s$, which is coupled through the input winding (with turns designated 1) of transformer 103 to the emitter of transistor 104. A collector current from transistor 104 is connected to one end of the output winding of transformer 103, which is tapped and has a first turns ratio of N and a second turns ratio M, with respect to the input winding, the opposite end of which is connected to a common point, such as ground. An output signal voltage 106 is produced at the tap on the output winding of transformer 103 across the load resistance 107 (illustrated as a fixed resistance $R_L$ for convenience), the opposite end of which is connected to the common point, or ground. It will of course be understood that in accordance with common practice input voltage source 101 and load resistance 107 represent any convenient input and output apparatus, respectively.

Briefly, the collector of transistor 104 sees a load resistance $R_C$ equal to:

$$R_C = (N+M) \times R_L \qquad (1)$$

the input resistance $R_I$ is:

$$R_I = \frac{N+M+1}{M^2} \times R_L \quad (2)$$

and the power gain G is:

$$G = N+M+1 \quad (3)$$

These relationships are dependent upon the emitter of transistor 104 appearing as a virtual ground, which is not true except in the approximation from which these relationships are derived. Instead, the emitter of transistor 104 has an input resistance, resulting in an emitter error voltage 105, which is approximately described by:

$$R_e = r_e + \frac{r_{bb}}{h_{fe}+1} \quad (4)$$

where $r_{bb}$ is the base spreading resistance and $r_e$ is the nonlinear incremental emitter resistance of transistor 104, the latter of which is described by:

$$r_e = \frac{V_{BE}}{I_E} = \frac{V_{BE}}{I_O \times e^{\frac{qV_{BE}}{kT}}} \quad (5)$$

where $I_E$ is the emitter current, $I_O$ is the saturation current, and $V_{BE}$ is the base-emitter voltage of transistor 104, the last of which is equal to $-V_{105}$. This voltage constitutes an error voltage 105 at the emitter of transistor 104, which can be detected and used to provide a correction signal for the common-base transistor, essentially reducing the emitter error voltage and reducing the non-linearity of the lossless feedback transistor amplifier.

Figure 2:
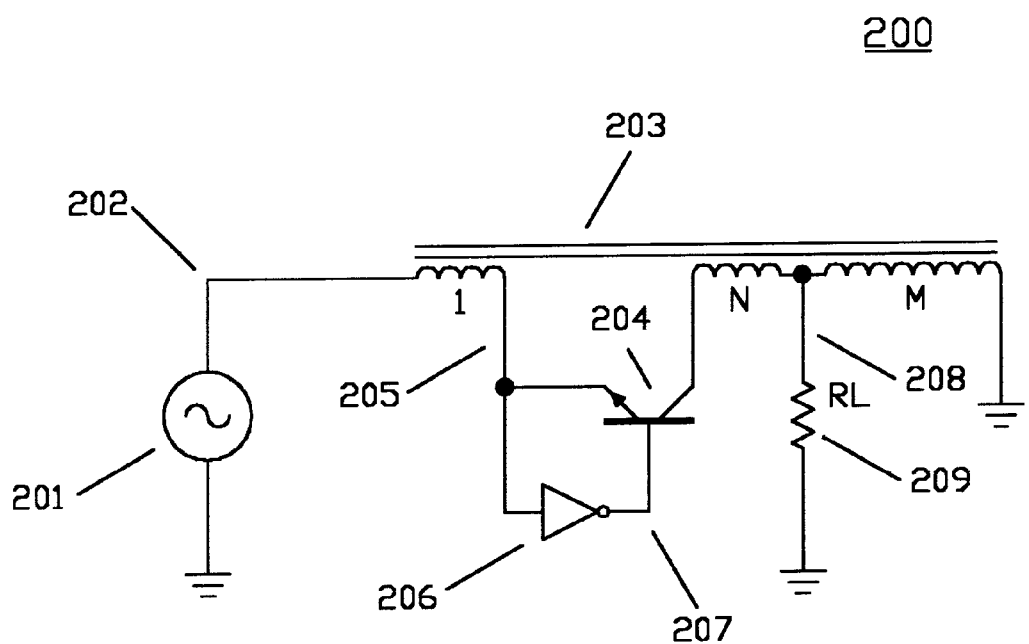
FIG. 2 schematically illustrates an inverting amplifier in a lossless-feedback transistor amplifier in accordance with the present invention.

Turning now to FIG. 2, a lossless feedback transistor amplifier circuit 200 in accordance with the present invention is illustrated. Circuit 200 includes an input signal voltage source 201, supplying an input signal voltage 202, having an amplitude A and a frequency $f_S$, which is coupled through an input winding (with turns designated 1) of a transformer 203 to the emitter of a transistor 204. An augmentation circuit including a voltage amplifier 206 has an input connected to the emitter of transistor 204 and an output connected to the base of transistor 204. The collector of transistor 204 is connected to one end of an output winding of transformer 203, which is tapped and has a first turns ratio of N and a second turns ratio M, with respect to the input winding, the opposite end of which is connected to a common point, such as ground. An output signal voltage 208 is produced at the tap on the output winding of transformer 203 across a load resistance 209 (illustrated as a fixed resistance $R_L$ for convenience), the opposite end of which is connected to the common point, such as ground. Augmentation amplifier 206 has an inverting voltage gain factor of $-A_V$, producing an amplified error voltage 207, which is coupled to the base of transistor 204. This voltage is described as:

$$V_{207} = -A_V \times V_{205} \quad (6)$$

where $V_{205}$ is the emitter error voltage 205. The resulting base-emitter voltage $V_{BE}$ of transistor 204 becomes:

$$V_{BE} = V_{207} - V_{205} = -A_V \times V_{205} - V_{205} = -V_{205} \times (A_V+1) \quad (7)$$

Substituting EQ. 7 into EQ. 5, we find that the apparent emitter resistance $r_e'$ becomes approximately:

$$r_e' = \frac{V_{205}}{I_E} = \frac{V_{205}}{I_O \times e^{\frac{qV_{205} \times (A_V+1)}{kT}}} = \frac{V_{BE}}{(A_V+1) \times I_O \times e^{\frac{qV_{BE}}{kT}}} \quad (8)$$

From inspection of EQ. 8 it is obvious that the apparent emitter resistance $r_e'$ is greatly reduced as the voltage gain $A_V$ of augmentation amplifier 206 is increased, and therefore the emitter error voltage is decreased, which in turn reduces the nonlinearity of lossless feedback transistor amplifier 200. Thus, the addition of augmentation amplifier 206 has caused the emitter terminal of transistor 204 to appear as a better approximation of a virtual ground, thus achieving the necessary condition discussed earlier for linearizing lossless feedback transistor amplifier 200.

Figure 3:
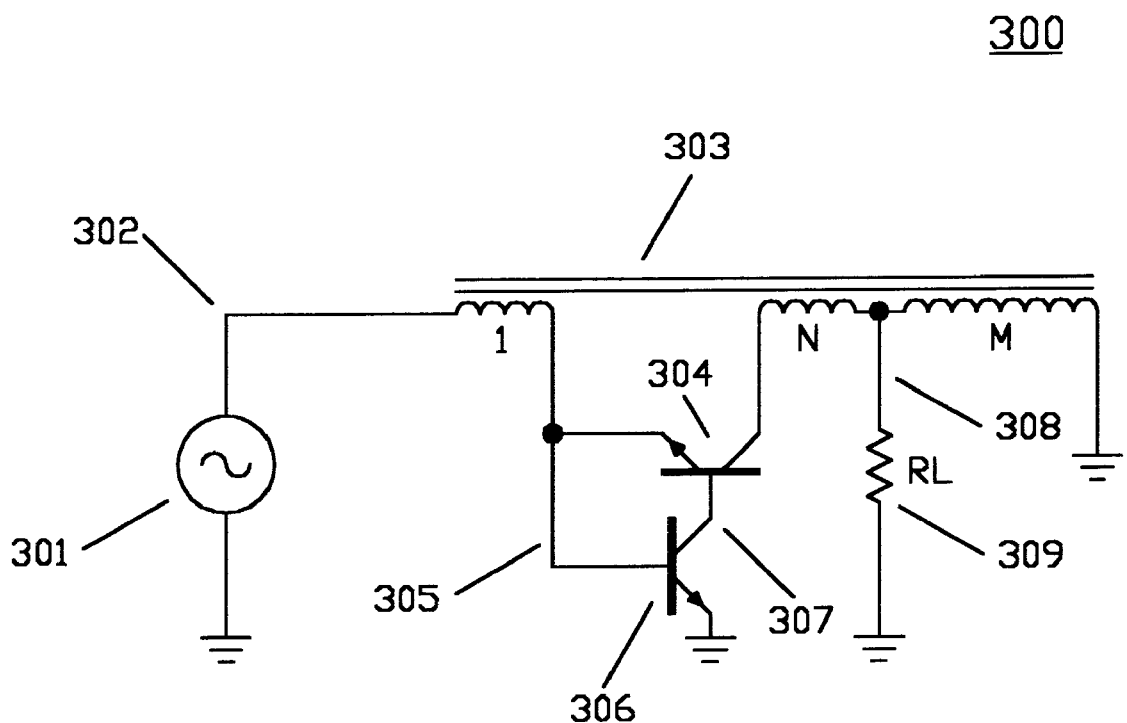
FIG. 3 schematically illustrates a common-emitter amplifier in a lossless-feedback transistor amplifier in accordance with the present invention.

In some applications, particularly those at higher frequencies, the use of augmentation amplifier 206 as shown in FIG. 2 may be impractical. Referring specifically to FIG. 3, another embodiment of an augmented lossless feedback transistor amplifier in accordance with the present invention, designated 300, is illustrated. Circuit 300 includes an input signal voltage source 301, supplying an input voltage 302, which is coupled through an input winding (with turns designated 1) of a transformer 303 to the emitter of a transistor 304. An augmentation circuit including a common-emitter transistor amplifier 306 has a base connected to the emitter of transistor 304, an emitter connected to a common point or ground, and a collector connected to the base of transistor 304. The collector of transistor 304 is connected to one end of an output winding of transformer 303, which is tapped and has a first turns ratio of N and a second turns ratio M, with respect to the input winding, the opposite end of which is connected to a common point, such as ground. An output signal voltage 308 is produced at the tap on the output winding of transfromer 303 across a load resistance 309 (illustrated as a fixed resistance $R_L$ for convenience), the opposite end of which is connected to the common point, such as ground. In this case, an apparent emitter input current $I_E'$ is described as:

$$I_E' = I_{E1} + I_{B2} \quad (9)$$
$$= I_{B1} \times (h_{fe1}+1) + \frac{I_{B1}}{h_{fe2}}$$
$$= \left(h_{fe1}+1+\frac{1}{h_{fe2}}\right) \times I_{O2} \times e^{\frac{qV_{305}}{kT}}$$

where $h_{fe1}$ is the signal current gain of transistor 304, $h_{fe2}$ is the signal current gain of transistor 306, $I_{O2}$ is the saturation current of transistor 306, and $V_{305}$ is the emitter error voltage 305. Substituting EQ. 9 into EQ. 5, we find that the apparent emitter resistance $r_e'$ becomes approximately:

$$r_e' = \frac{V_{305}}{I_E'} = \frac{V_{305}}{\left(h_{fe1}+1+\frac{1}{h_{fe2}}\right) \times I_{O2} \times e^{\frac{qV_{305}}{kT}}} \quad (10)$$

which is a considerable reduction in the nonlinear emitter resistance $r_e'$ of the common-base transistor 304, and thus showing that the use of common emitter transistor amplifier 306 is a suitable alternative for an augmentation circuit.

Figure 4:
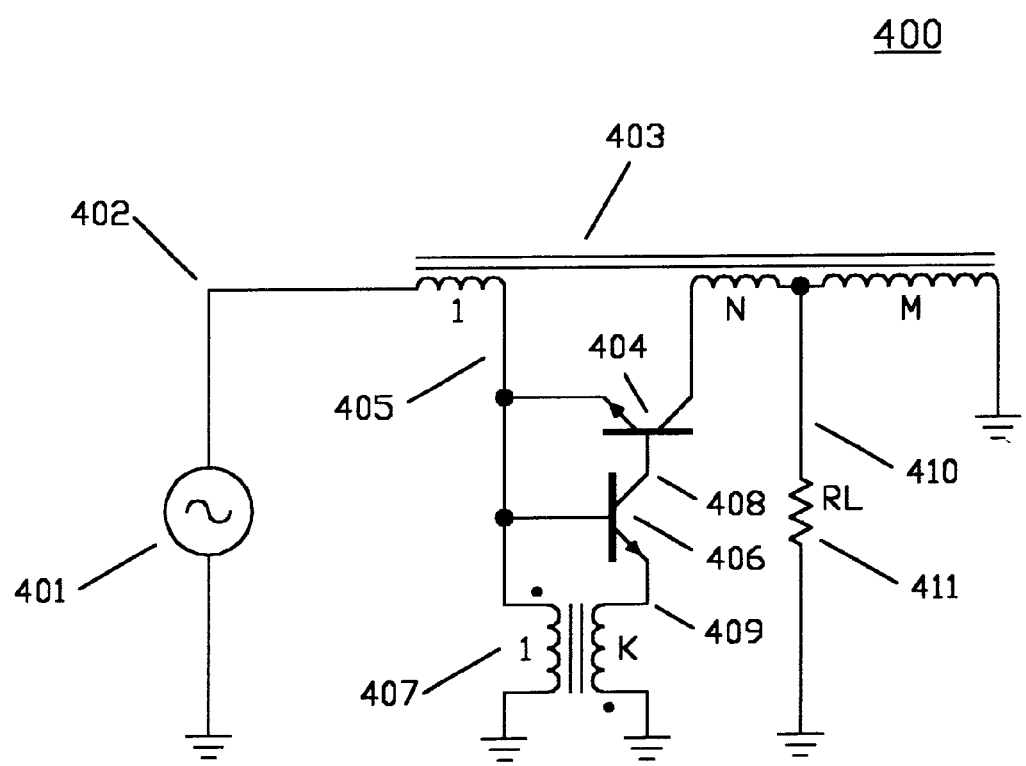
FIG. 4 schematically illustrates a transformer in a lossless-feedback transistor amplifier in accordance with the present invention.

For applications where IM performance requires higher gain from augmenting common-emitter transistor amplifier 306, a positive feedback transistor amplifier circuit may be used. Referring specifically to FIG. 4, another embodiment of a lossless feedback transistor amplifier circuit in accordance with the present invention, designated 400, is illustrated. Circuit 400 includes an input signal voltage source 401, supplying an input voltage 402, which is coupled through an input winding (with turns designated 1) of a transformer 403 to the emitter of a transistor 404. The collector of transistor 404 is connected to one end of an output winding of transformer 403, which is tapped and has a first turns ratio of N and a second turns ratio M, with respect to the input winding, the opposite end of which is connected to a common point, such as ground. An output signal voltage 410 is produced at the tap on the output winding of transformer 403 across a load resistance 411 (illustrated as a fixed resistance $R_L$ for convenience), the opposite end of which is connected to a common point, such as ground.

An augmentation circuit includes a positive feedback, or regenerative, transistor amplifier which further includes a transistor 406 and a transformer 407, the base of transistor 406 connected to the emitter of transistor 404 and the collector of transistor 406 connected to the base of transistor 404. A primary winding of transformer 407 (with turns designated 1) has one end connected to the base of transistor 406 and the opposite end connected to a common point, such as ground. A secondary winding of transformer 407 (with turns ratio of K with respect to the primary winding) is connected, in reverse phase relative to the primary, between the emitter of transistor 406 and the common or ground, producing an emitter voltage 409 at the emitter of transistor 406. Transformer 407 provides positive feedback for transistor 406, thereby resulting in a positive feedback, or regenerative, amplifier for augmenting transistor 404. Those familiar with the art will recognize that the positive feedback augmenting amplifier consisting of transistor 406 and transformer 407 is one of many positive feedback, or regenerative, amplifiers that can be used for augmenting the lossless feedback transistor amplifier 400.

Figure 5:
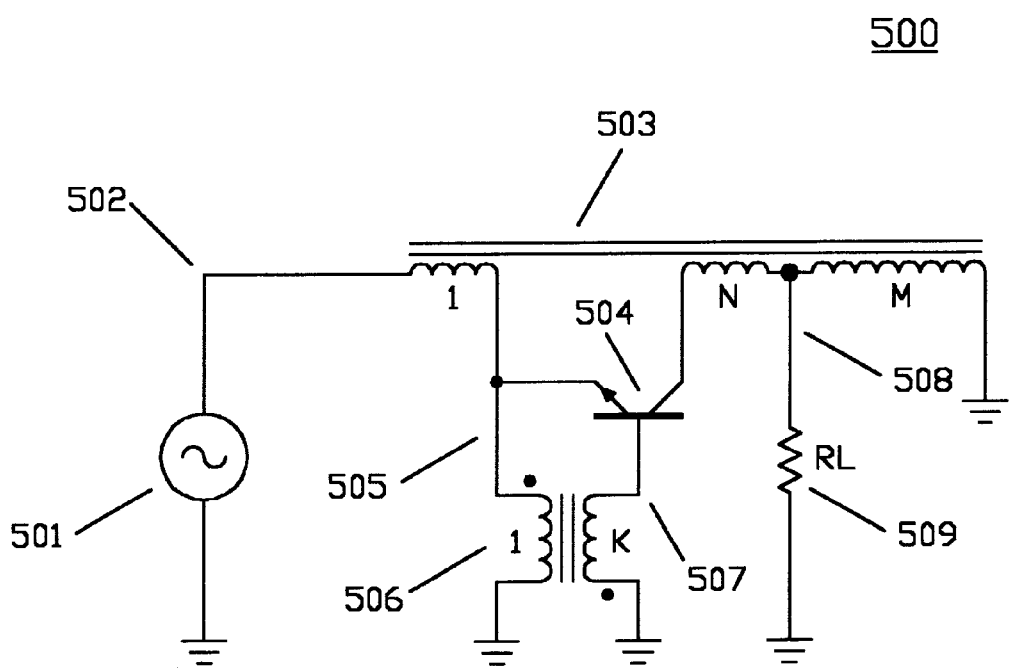
FIG. 5 schematically illustrates a positive-feedback amplifier in a lossless-feedback transistor amplifier in accordance with the present invention.

For applications at high frequencies where the noise figure (NF) of the lossless feedback transistor amplifier is a consideration, the use of a common-emitter augmentation amplifier (e.g. 306) or a positive feedback augmentation amplifier (e.g. 406 and 407) may be impractical as such circuits may introduce additional noise, thus degrading the NF of the lossless feedback transistor amplifier. For such applications, the use of a simple transformer can give sufficient voltage gain to provide augmentation. Referring specifically to FIG. 5, another embodiment of a lossless feedback transistor amplifier circuit in accordance with the present invention, designated 500, is illustrated. Circuit 500 includes an input signal voltage source 501, supplying an input voltage 502, which is coupled through an input winding (with turns designated 1) of a transformer 503 to the emitter of a transistor 504. The collector of transistor 504 is connected to one end of an output winding of transformer 503, which is tapped and has a first turns ratio of N and a second turns ratio M, with respect to the input winding, the opposite end of which is connected to a common point, such as ground. An output signal voltage 508 is produced at the tap on the output winding of transformer 503 across a load resistance 509 (illustrated as a fixed resistance $R_L$ for convenience), the opposite end of which is connected to a common point, such as ground. An augmentation circuit including a transformer 506 has a primary winding (with turns designated 1) connected between the emitter of transistor 504 and a common point, such as ground. A secondary winding of transformer 506 (with turns ratio of K with respect to the primary winding) is connected, in reverse phase relative to the primary, between the base of transistor 504 and the common point or ground, producing a base voltage 507. The base-emitter voltage $V_{BE}$, being the difference between the base voltage 507 and the emitter voltage 505, and base current $I_B$ of transistor 504 are, respectively:

$$V_{BE} = V_{507} - V_{505} = -K \times V_{505} - V_{505} = -V_{505} \times (K+1) \tag{11}$$

$$I_B = \frac{I_E}{h_{fe}} \tag{12}$$

which makes the apparent emitter input current $I_E'$ equal to:

$$I_E' = I_E - \frac{K \times I_E}{h_{fe}} = I_E \times \left(1 - \frac{K}{h_{fe}}\right) \tag{13}$$

where $$I_E = I_O \times e^{\frac{q(1+K)V_{505}}{kT}} = I_O \times \left[e^{\frac{qV_{505}}{kT}}\right]^{(1+K)} \tag{14}$$

which allows the apparent emitter resistance $r_e'$ to be approximated as:

$$r_e' = \frac{V_{505}}{I_E'} \tag{15}$$

$$= \frac{V_{505}}{\left(1 - \frac{K}{h_{fe}}\right) \times I_O \times e^{\frac{q(K+1)V_{505}}{kT}}}$$

$$= \frac{V_{BE}}{(K+1) \times \left(1 - \frac{K}{h_{fe}}\right) \times I_O \times e^{\frac{qV_{BE}}{kT}}}$$

which, compared to EQ. 4, shows that the apparent emitter resistance $r_e'$ decreases dramatically as the turns ratio K of transformer 506 is increased, showing that transformer 506 does provide augmentation of common-base transistor 504, and in turn linearizes lossless feedback transistor amplifier 500.

Figure 6:
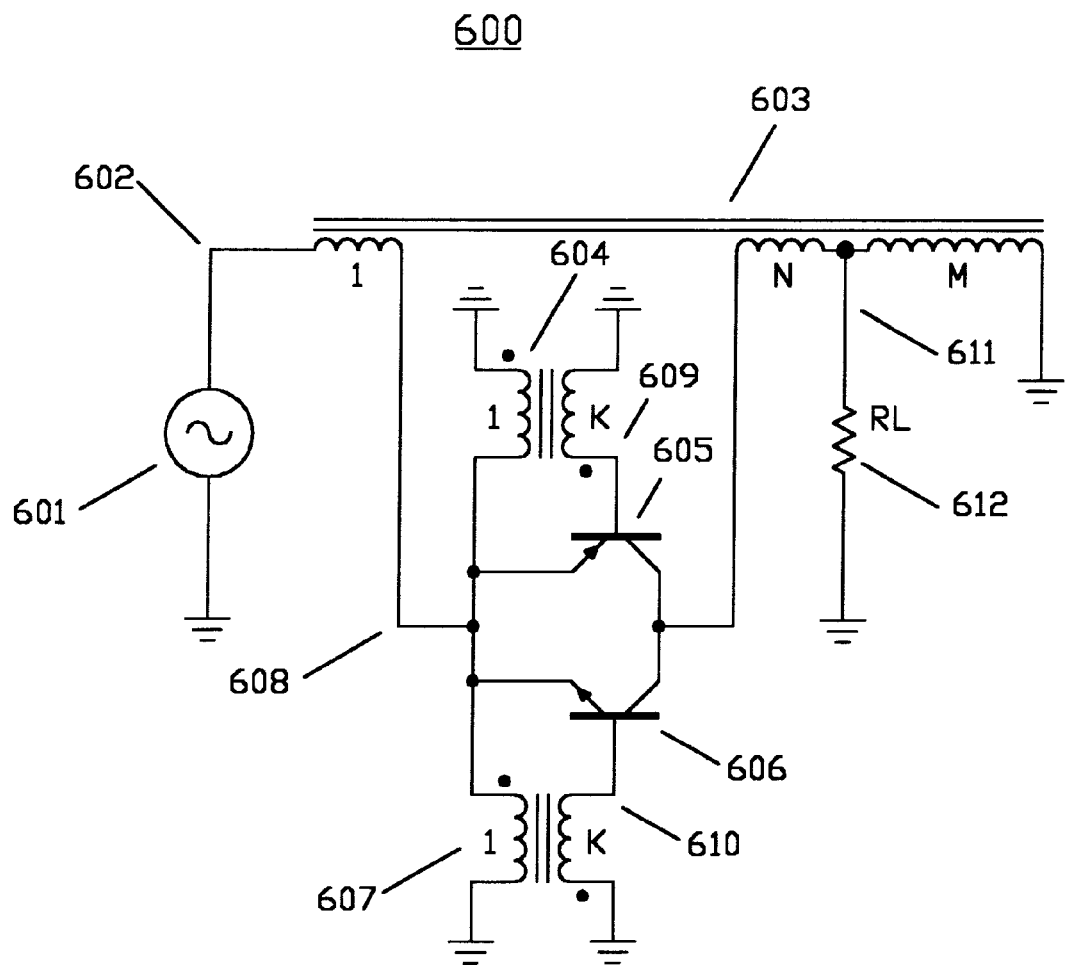
FIG. 6 schematically illustrates the addition of a complementary pair of transformer-augmented common-base transistor amplifiers in a lossless-feedback transistor amplifier.

The use of augmentation in lossless feedback transistor amplifiers is not limited to single-ended applications. A complementary pair of augmented common-base transistor amplifiers, one using an NPN transistor and the other using a PNP transistor, can be used in applications requiring high degrees of linearity. Referring specifically to FIG. 6, a lossless feedback transistor amplifier circuit 600, in accordance with the present invention, is illustrated. Circuit 600 includes an input signal voltage source 601, supplying an input signal voltage 602, which is connected to one terminal of an input winding (with turns designated 1) of a transformer 603, the other terminal of which is connected to the emitter junctions of transistors 605 and 606, transistor 605 being of the positive or PNP polarity, and transistor 606 being of the negative or NPN polarity. The collectors of transistors 605 and 606 are connected to one end of an output winding of transformer 603, which is tapped and has a first turns ratio of N and a second turns ratio M, with respect to the input winding, the opposite end of which is connected to a common point, such as ground. An output signal voltage 611 is produced at the tap on the output winding of transformer 603 across a load resistance 612 (illustrated as a fixed resistance $R_L$ for convenience), the opposite end of which is connected to the common point or ground.

A first augmentation circuit including a transformer 604 has a primary winding (with turns designated 1) connected between the emitter of transistor 605 and a common point such as ground. A secondary winding of transformer 604

(with turns ratio of K with respect to the primary winding) is connected, in reverse phase relative to the primary, between the base of transistor 605 and the common or ground, producing a base voltage 609 at the base of transistor 605. A second augmentation circuit including a transformer 607 has a primary winding (with turns designated 1) connected between the emitter of transistor 606 and a common point such as ground. A secondary winding of transformer 607 (also with turns ratio of K with respect to the primary winding) is connected, in reverse phase relative to the primary, between the base of transistor 606 and the common or ground, producing a base voltage 610, similar to the base voltage 609 at the base of transistor 605. In this embodiment, PNP transistor 605 is augmented with transformer 604, and the complementary NPN transistor 606 is augmented with transformer 607, reducing the emitter voltage 608, and thereby providing a high degree of linearity without impacting the NF of the lossless feedback transistor amplifier. Those familiar with the art will recognize that this application may employ any of the augmention methods described earlier.

Although detailed embodiments of the invention have been described, it should be appreciated that numerous modifications, variations, and adaptations may be made without departing from the scope of the invention as described in the claims. For example, the bipolar transistors shown in the embodiments may be alternatively replaced with field effect transistors. Further, while the terminals of the bipolar transistors described in the various embodiments are referred to as the emitter, base, and collector, it will be understood that these terminals will be the source, gate, and drain, respectively, when the transistors utilized are field effect transistors or other similar types and may be referred to as input, control, and output terminals, respectively, however the titles of the various components and terminals are only intended to enhance the understanding of the disclosure and are not intended to in any way limit the type of component utilized. In addition, it should be understood that the term "common-base transistor amplifier" used throughout this disclosure refers to a general type of amplifier and should not be limited in any way to prior concepts of common-base amplifiers.

What is claimed is:

1. An augmented lossless feedback transistor amplifier circuit for amplifying an input signal and producing a linearized output signal comprising:

an input terminal for receiving an input signal;

an output terminal for providing an output signal;

a common-base transistor amplifier having an input, a control, and an output;

an augmentation circuit having an input and an output, the input connected to the input of the common-base transistor amplifier and the output connected to the control of the common-base transistor amplifier, wherein the purpose of the augmentation circuit is to reduce the input impedance of the common-base transistor amplifier and to subsequently increase the linearity of the common-base transistor amplifier and in turn the linearity of the augmented lossless feedback amplifier; and a feedback transformer, having an input winding and a tapped output winding, the first end of the input winding connected to the signal input terminal of the augmented lossless feedback amplifier circuit, the second end of the input winding connected to the input of the common-base transistor amplifier and the input of the augmentation circuit, the first end of the output winding connected to the output of the common-base transistor amplifier, the second end of the output winding connected to signal ground, and the output winding tap connected to the signal output terminal of the augmented lossless feedback transistor amplifier circuit.

2. A complementary lossless feedback transistor amplifier circuit for amplifying an input signal and producing an augmented output signal comprising:

a first common-base transistor amplifier of the first polarity having an input terminal, a control terminal, and an output terminal;

a first augmentation circuit connected between the input terminal of the first common-base transistor amplifier and the control terminal of the first common-base transistor amplifier, wherein the purpose of the first augmentation circuit is to reduce the input impedance of the first common-base transistor amplifier and to subsequently increase the linearity of the first common-base transistor amplifier and in turn the linearity of the complementary augmented lossless feedback amplifier;

a second common-base transistor amplifier of the second polarity having an input terminal, a control terminal, and an output terminal;

a second augmentation circuit connected between the input terminal of the second common-base transistor amplifier and the control terminal of the second common-base transistor amplifier, wherein the purpose of the second augmentation circuit is to reduce the input impedance of the second common-base transistor amplifier and to subsequently increase the linearity of the first common-base transistor amplifier and in turn the linearity of the complementary augmented lossless feedback amplifier; and a transformer connected between a common connection of the input of the first common-base transistor amplifier, the input of the first augmentation circuit, the input of the second common-base transistor amplifier, and the input of the second augmentation circuit, and a common connection of the output of the first common-base transistor amplifier and the output of the second common-base transistor amplifier for providing lossless feedback.

3. An augmented common-base transistor amplifier circuit, as claimed in claim 1, wherein the augment circuit further includes an inverting voltage amplifier, having an input and an output, the input of the inverting amplifier connected to the input of the augmentation circuit and the output of the invertin amplifier connected to the output of the augmentation circuit.

4. An augmented common-base transistor amplifier circuit, as claimed in claim 1, wherein the augmentation circuit further includes a common-emitter transistor amplifier, the input of the common-emitter transistor amplifier connected to the input of the augmentation circuit, and the output of the common-emitter amplifier circuit connected to the output of the augmentation circuit.

5. An augmented common-base transistor amplifier circuit, as claimed in claim 1, wherein the augmentation circuit further includes an inverting positive feedback amplifier, the input of the positive feedback amplifier connected to the input of the augmentation circuit and the output of the positive feedback amplifier circuit connected to the output of the augmentation circuit.

6. An augmented common-base transistor amplifier circuit, as claimed in claim 1, wherein the augmentation circuit further includes a transformer having a primary winding and a secondary winding, the primary winding connected to the input terminal of the augmentation circuit and the secondary winding connected to the output of the augmentation circuit in reverse phase relative to the primary winding.

7. An augmented complementary lossless feedback transistor amplifier circuit for amplifying an input signal and producing a linearized output signal comprising:

an input terminal for receiving an input signal;

an output terminal for providing an output signal;

a first common-base transistor amplifier of the first polarity having an input, a control, and an output;

a first augmentation circuit having an input and an output, the input connected to the input of the first common-base transistor amplifier and the output connected to the control of the first common-base transistor amplifier, wherein the purpose of the first augmentation circuit is to reduce the input impedance of the first common-base transistor amplifier and to subsequently increase the linearity of the first common-base transistor amplifier and in turn the linearity of the complementary augmented lossless feedback amplifier;

a second common-base transistor amplifier of the second polarity having an input, a control, and an output;

a second augmentation circuit having an input and an output, the input connected to the input of the second common-base transistor amplifier and the output connected to the control of the second common-base transistor amplifier, wherein the purpose of the second augmentation circuit is to reduce the input impedance of the second common-base transistor amplifier and to subsequently increase the linearity of the second common-base transistor amplifier and in turn the linearity of the complementary augmented lossless feedback amplifier; and a feedback transformer, having an input winding and a tapped output winding, the first end of the input winding connected to the signal input terminal of the complementary augmented lossless feedback amplifier circuit, the second end of the input winding connected to the input of the first common-base transistor amplifier, the input of the first augmentation circuit, the input of the second common-base transistor amplifier, and the input of the second augmentation circuit, the first end of the output winding connected to the output of the first common-base transistor amplifier and the output of the second common-base transistor amplifier, the second end of the output winding connected to signal ground, and the output winding tap connected to the signal output terminal of the augmented complementary lossless feedback transistor amplifier circuit.

8. A method of correcting the nonlinearity of a lossless feedback transistor amplifier circuit comprising the steps of:

providing an input signal to the input winding of a feedback transformer;

applying the current of the input winding of the feedback transformer to the emitter of a common-base transistor;

applying the collector current of the common-base transistor to the output winding of the feedback transformer;

comparing the current of the output winding of the feedback transformer with the current of the input winding;

applying the difference between the feedback transformer input current and output current to the emitter of the common-base transistor, thus correcting the difference between the input and output current of the common-base transistor;

detecting an error voltage at the emitter of the common-base transistor;

amplifying and inverting the detected emitter error voltage; and applying the amplified and inverted emitter error voltage to the base of the common-base transistor, providing a correction for minimizing the emitter error voltage and thus linearizing the input current of the common-base transistor.

9. A lossless feedback transistor amplifier circuit for amplifying an input signal and producing an augmented output signal comprising:

a common-base transistor amplifier having an input terminal, a control terminal, and an output terminal;

an augmentation circuit connected between the input terminal of the common-base transistor amplifier and the control terminal of the common-base transistor amplifier, wherein the purpose of the augmentation circuit is to reduce the input impedance of the common-base transistor amplifier and to subsequently increase the linearity of the common-base transistor amplifier and in turn the linearity of the augmented lossless feedback amplifier; and a transformer connected between the common connection of the input of the common-base transistor amplifier and the input terminal of the augmentation circuit, and the output terminal of the common-base transistor amplifier for providing lossless feedback.

10. A lossless feedback transistor amplifier circuit as claimed in claim 9 wherein the augmentation circuit includes a transformer having a primary winding and a secondary winding, with the primary winding connected to the input terminal of the common-base transistor amplifier and the secondary winding connected in reverse phase to the control terminal of the common-base transistor amplifier.

11. A lossless feedback transistor amplifier circuit as claimed in claim 9 wherein the augmentation circuit includes an inverting amplifier having an input terminal connected to the input terminal of the common-base transistor amplifier and an output terminal connected to the control terminal of the common-base transistor amplifier.

12. A lossless feedback transistor amplifier circuit as claimed in claim 9 wherein the augmentation circuit includes a common-emitter transistor amplifier having an input terminal connected to the input terminal of the common-base transistor amplifier and an output terminal connected to the control terminal of the common-base transistor amplifier.

13. A lossless feedback transistor amplifier circuit as claimed in claim 9 wherein the augmentation circuit includes an inverting positive-feedback amplifier having an input terminal connected to the input terminal of the common-base transistor amplifier and an output terminal connected to the control terminal of the common-base transistor amplifier.

* * * * *